United States Patent [19]

Lindmayer

[11] Patent Number: 5,012,098

[45] Date of Patent: * Apr. 30, 1991

[54] PHOTOMULTIPLIER WITH INFRARED SENSITIVITY

[75] Inventor: Joseph Lindmayer, Potomac, Md.

[73] Assignee: Quantex Corporation, Rockville, Md.

[*] Notice: The portion of the term of this patent subsequent to Nov. 10, 2004 has been disclaimed.

[21] Appl. No.: 313,171

[22] Filed: Feb. 21, 1989

Related U.S. Application Data

[63] Continuation-in-part of Ser. No. 147,215, Jan. 22, 1988, Pat. No. 4,879,186, which is a continuation-in-part of Ser. No. 870,809, Jun. 6, 1986, Pat. No. 4,830,875, which is a continuation-in-part of Ser. No. 786,095, Oct. 10, 1985, Pat. No. 4,705,952.

[51] Int. Cl.$^5$ ............ G01J 1/00; G01J 1/58; H05B 33/00; B66D 1/14
[52] U.S. Cl. ............ 250/339; 250/338.1; 250/347; 250/484.1; 250/486.1; 252/301.45; 252/301.4 P
[58] Field of Search ......... 250/338.1, 339, 347, 250/484.1, 486.1, 327.2 L; 252/301.45, 301.4 P

[56] References Cited

U.S. PATENT DOCUMENTS

| | | | |
|---|---|---|---|
| 4,446,048 | 5/1984 | Randy et al. | 252/301.45 |
| 4,451,530 | 5/1984 | Kaule et al. | 250/336.1 X |
| 4,500,116 | 2/1985 | Ferro et al. | 250/486.1 X |
| 4,705,952 | 11/1987 | Lindmayer | 250/484.1 |
| 4,806,772 | 2/1989 | Lindmayer | 250/484.1 |
| 4,879,186 | 11/1989 | Takeguchi | 97/344 |

Primary Examiner—Constantine Hannaher
Assistant Examiner—J. Eisenberg
Attorney, Agent, or Firm—Ostrolenk, Faber, Gerb & Soffen

[57] ABSTRACT

An efficient energy upconversion unit is optically coupled to a photomultiplier. The upconversion unit receives incident infrared electromagnetic energy of longer wavelengths and emits, in response, visible light of shorter wavelengths to which the photomultiplier is more responsive. Through such energy upconversion, the sensitivity of the photomultiplier is extended to much longer infrared wavelengths. The upconversion unit is a photoluminescent material specially formulated to have minimal phosphorescence so as to minimize noise.

19 Claims, 5 Drawing Sheets

PHOTOMULTIPLIER WITH INFRARED SENSITIVITY

This is a continuation-in-part of U.S. application Ser. No 147,215, filed Jan. 22, 1988, now U.S. Pat. No. 4,879,186, which is a continuation-in-part of U.S. application Ser. No. 870,809, filed June 6, 1986, now U.S. Pat. No. 4,830,875, which is a continuation-in-part of U.S. application Ser. No. 786,095, filed Oct. 10, 1985, now U.S. Pat. No. 4,705,952.

BACKGROUND OF THE INVENTION

1. Field of the Invention

This invention relates generally to photomultipliers and, more particularly, to an upconverter which allows operation of photomultipliers beyond their normal wavelength cut-off, thereby making possible detection of infrared light.

2. Description of the Related Art

Sensitivity, that is, the ability to develop useful information from weak signals, is a desirable characteristic of photomultipliers. However, it is well known that photomultipliers display rapidly decreasing spectral sensitivity at longer wavelengths, culminating in a complete cut-off at wavelengths beyond 1 micron. On the other hand, the wavelength region of 1-2 microns represents an important application range, encompassing, for example: (1) the emission wavelength of numerous lasers; (2) the reflection and absorption characteristics observed through spectroscopy; (3) the fiber optic communication wavelengths (1.3 and 1.55 microns); and many others. Typically, solid state detectors, such as Ge, InGaAs and others, are used to detect these longer wavelengths. Unfortunately, such detectors have a relatively small active area and are quite noisy at low light levels as compared to photomultipliers.

Therefore, in terms of detection area and noise, it would be highly desirable to convert infrared wavelengths to be detected into visible light wavelengths within the sensitivity range of a photomultiplier. The present inventor has developed certain photoluminescent materials which perform such optical upconversion with an increased quantum efficiency and a notably brighter light output than prior art phosphors. See, for example, U.S. Pat. Nos. 4,806,772 and 4,879,186, the disclosures of which are herein incorporated by reference. However, these new photoluminescent materials exhibit a considerable phosphorescence which would constitute noise to the photomultiplier. Thus, up to now, it has not been utilize these materials for upconversion purposes to extend the sensitivity of the photomultiplier into the infrared region of the spectrum.

SUMMARY OF THE INVENTION

It is therefore an important object of this invention to provide new photoluminescent material which can be used as an energy upconverter for a photomultiplier to yield a device which is highly sensitive to low level infrared radiation.

The present invention achieves the foregoing object by providing an energy upconverter comprising a novel photoluminescent material with decreased phosphorescence, and optically coupling this material to a conventional photomultiplier. The energy upconverter receives electromagnetic energy in the near infrared range of the spectrum (to which the photomultiplier is insensitive) and, in response thereto, emits electromagnetic energy in the visible range of the spectrum (to which the photomultiplier is usefully responsive).

The photoluminescent material which serves as an energy upconverter is coated onto a substrate and pre-charged with energy from visible light. The visible light pre-charge raises electrons in the photoluminescent material from a ground level to a higher trapping energy level. When near infrared radiation is incident upon the charged material, it releases electrons from the higher trapping energy level, resulting in emission of visible light to which the photomultiplier is sensitive.

The photoluminescent material utilized in the present invention is formed of a strontium sulfide or calcium sulfide base doped with a samarium compound and a europium compound, and a fusible salt, similar to those disclosed in the inventor's above-noted patent applications. In order to avoid the above-described problem relating to phosphorescence, strontium carbonate is added to the material with a strontium sulfide base, and calcium carbonate is added to the material with a calcium carbonate base. These carbonates take the place of the barium sulfate in the photoluminescent materials disclosed in the aforementioned U.S. Pat. Nos. 4,806,771 and 4,879,186. The concentrations of dopants and the fusing temperatures are also adjusted to minimize phosphorescence.

The resultant photoluminescent material exhibits a phosphorescence which is on the order of 10 times lower than the inventor's prior photoluminescent materials, without any significant loss in quantum efficiency. This high efficiency, low phosphorescence material, when coupled with the high conversion efficiency of a photomultiplier, yields an infrared detector with a sensitivity orders of magnitude greater than that of infrared solid state detectors.

BRIEF DESCRIPTION OF THE DRAWINGS

These and other features and advantages of the present invention will become apparent when the following text is read in conjunction with the accompanying drawings, in which.

DESCRIPTION OF THE PREFERRED EMBODIMENTS

Figures 1, 3:
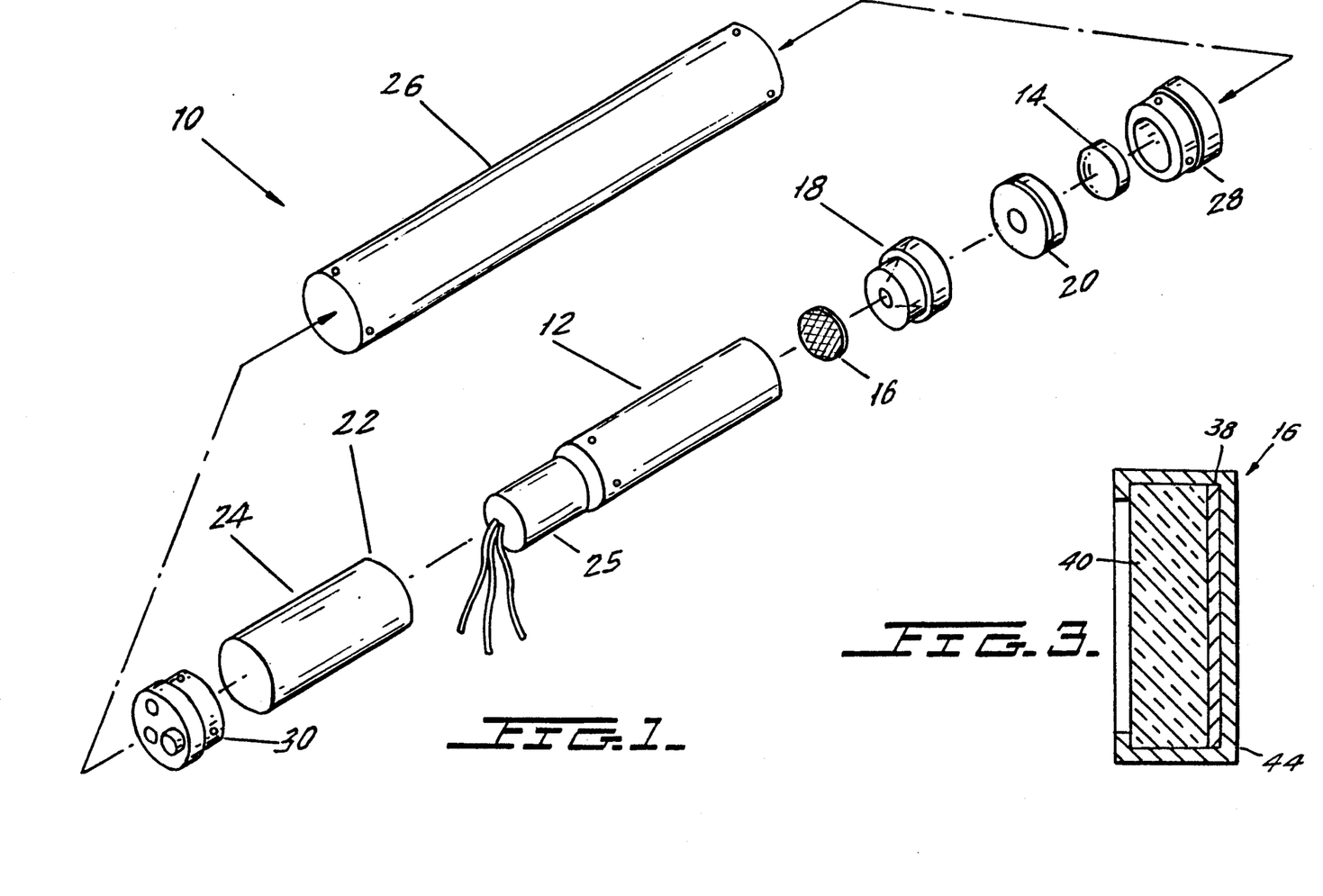
FIG. 1 is a schematic view of a photomultiplier assembly constructed in accordance with the present invention.
FIG. 3 is a central sectional view of an energy upconverter constructed for use in the photomultiplier assembly of FIG. 1.

Referring now in detail to the drawings, specifically to FIG. 1, the photomultiplier assembly of the present invention is indicated generally by the reference numeral 10. Assembly 10 comprises a photomultiplier 12, a long wavelength filter 14, and an energy upconverter 16 disposed between filter 14 and photomultiplier 12. The input optics also include a light reflector 18 and a LED charge ring 20 disposed between upconverter 16 and filter 14. LED charge ring 20 is used to periodically charge up the photoluminescent material of energy upconverter 16, as discussed in further detail below. After the photoluminescent material has been charged up, it emits a phosphorescence which is a greatly reduced as compared to the inventor's prior photoluminescent materials, and which therefore decays to acceptable levels within a much shorter time period.

Filter 14 serves to prevent external visible light from reaching and charging up the photoluminescent material, which would re-start the period of phosphorescence decay. In order to provide for absorption of any infrared energy reflected from upconverter 16, an infrared reflector can be disposed between filter 14 and upconverter 16 and oriented toward upconverter 16. Similarly, a second infrared reflector can be disposed between energy upconverter 16 and photomultiplier 12 and oriented toward energy converter 16 to reflect back any infrared energy which passes through energy converter 16.

Light reflector 18 is a cone concentrator which serves to maximize the angle of acceptance for a smaller area of photoluminescent material. This is desirable because a smaller area material exhibits less phosphorescence. In the preferred embodiment of the invention, the material has a diameter of about 1 cm, while the acceptance diameter of the light reflector cone 18 is about 1 inch.

On the output side of the assembly 10, a spacer disk 22 and rear spacer 24 fit over the photomultiplier base 25. The entire assembly 10 is disposed within a housing 26, with a filter port 28 and cable end cap 30 serving as front and rear "plugs" to seal the assembly and protect the integrity of the internal components described above.

Figure 2A:
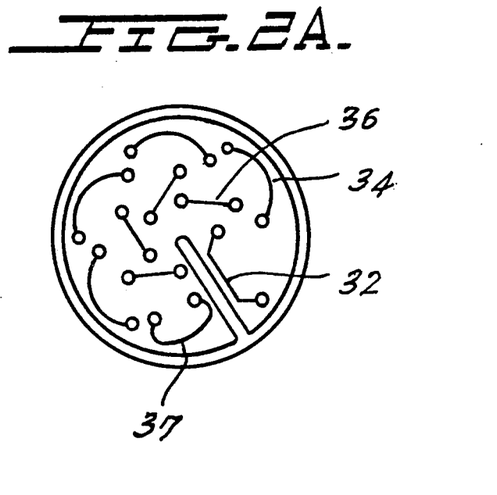
FIGS. 2A-2C show the electrode arrangement and voltage divider of a typical photomultiplier tube.
Figures 2B, 2C:
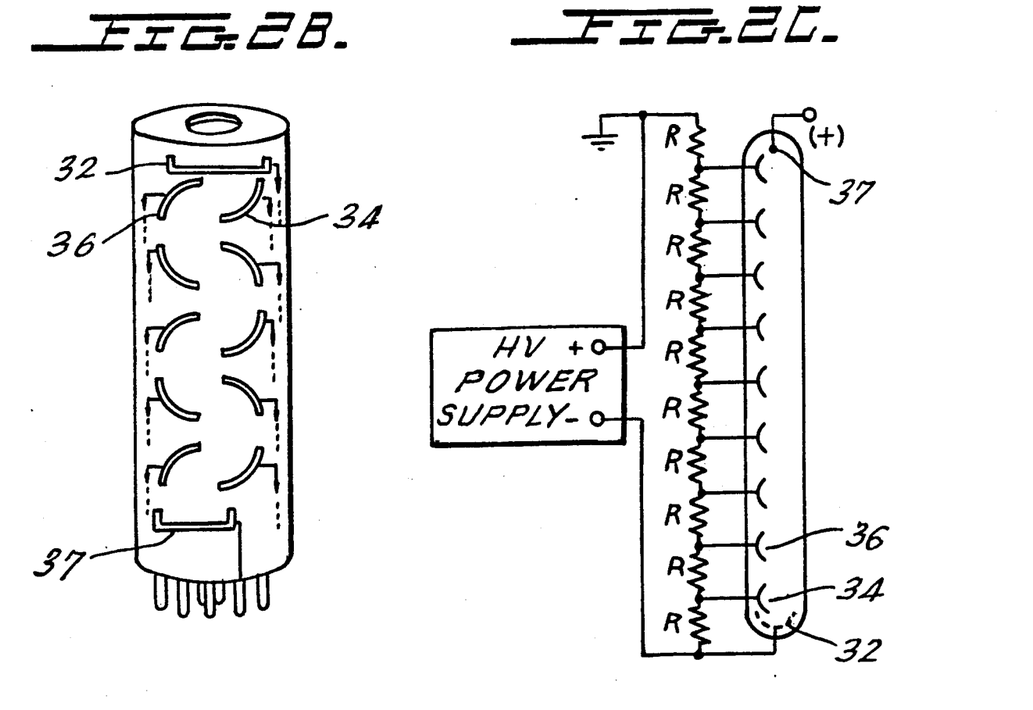

The electrode arrangement of a typical photomultiplier tube is shown in FIGS. 2A and 2B. The input radiation is incident on the photocathode 32 from which photoelectrons are ejected. Photocathode 32 emits electrons in quantities determined by its own spectral sensitivity and the wavelengths of the received radiation. A large fraction of the photoelectrons ejected by the photocathode are attracted to the first dynode 34 because the dynode is maintained at a positive voltage relative to the photocathode. The fraction of photoelectrons collected by the first dynode is typically about 75%. Depending upon the voltage and dynode characteristics, a certain probable number of secondary electrons (e.g., 4 or 5) will be ejected from the dynode for each photoelectron striking it. The secondary electrons from the first dynode 34 are attracted to the second dynode 36, where each electron ejects more secondary electrons—and likewise around the successive dynodes until the electrons are collected at the anode 37. The transfer efficiency of electron bursts between dynodes is almost unity so that the number of anode pulses is nearly equal to the number of photoelectrons reaching the first dynode. Each successive electrode must be at a higher potential than the previous one so that the electrons are attacted to the next dynode. A voltage divider that provides the required potential difference between successive dynodes is shown in FIG. 2C.

The various photocathodes known tend to lose their sensitivity very rapidly near 1 micron. For example, the photocathode of a Hamamatsu R1104 photomultiplier has a maximum spectral sensitivity at a wavelength of about 0.66 microns. This spectral sensitivity decreases rapidly with increasing wavelength, and such a photomultiplier is generally considered insensitive to wavelengths greater than 1.0 micron. In accordance with the present invention, such a limitation is overcome by use of the energy upconverter 16. This latter device is arranged to receive electromagnetic energy of wavelengths longer than those to which the photomultiplier is sensitive and to emit, in response thereto, electromagnetic energy at wavelengths to which the photomultiplier is normally usefully sensitive.

The energy upconverter 16 of the invention is constructed as illustrated in FIG. 3. There, a layer 38 of upconverting material is deposited on an optically transparent substrate 40, preferably formed of sapphire or some other transparent material. Substrate 40 and layer 38 are sealed in a container 44, forming upconverter disk 16. Alternatively, a layer of upconverting material 38 can be deposited directly on the photomultiplier faceplate itself.

An eminently useful material for the layer 38 is an infrared stimulable phosphor, composed of SrS and doped with Eu and Sm compounds, essentially a reduced phosphorescence version the phosphor described in U.S. Pat. No. 4,806,772, or a phosphor composed of CaS and doped with Eu and Sm compounds, a reduced phosphorescence modification of that described in U.S. Pat. No. 4,879,186, both assigned to the same assignee as the present invention. These materials are chargeable with visible wavelengths via LED charge ring 20 and will remain charged for extremely long times. These infrared phosphors can then be stimulated by wavelengths in the near infrared to emit bright light at wavelengths around 0.63–0.65 microns, this wavelength region being within the useful spectral sensitivity of a typical photomultiplier.

As will be appreciated for the foregoing description, the present invention employs a material for the layer 38 which can be stimulated by a wide range of longer-wavelength infrared signals and will re-emit light at shorter wavelengths. Most materials that absorb and re-radiate energy, re-radiate at wavelengths which are longer than those absorbed. However, there is a class of materials, called Anti-Stokes materials, which can absorb multiple photons of an infrared wavelength at an atomic-scale site and subsequently emit one visible-wavelength photon. A device which employs Anti-Stokes materials in upconversion for photocathode devices is set forth in U.S. Pat. No. 3,971,932 to Sewell et al. Unfortunately, Anti-Stokes materials necessarily only absorb in very narrow wavelength bands. Also, Anti-Stokes devices have extremely low conversion efficiencies, so they are not useful in low light situations.

Accordingly, instead of using Anti-Stokes materials as for layer 38, the present invention employs novel active materials which can separately store the energy necessary to later provide higher-energy shorter-wavelength photons upon lower-energy longer-wavelength photon excitation until the chosen time for imaging use of the apparatus. Such materials can absorb such energy from LED charge ring 20 or any suitable artificial visible light source and store a portion thereof for very significant times as the energy of electrons trapped in elevated-energy states. Upon arrival of lower energy photons, the trapped electrons provide wide-band response with an essentially intensity-independent conversion efficiency to produce short-wavelength light at or near the peak response of the photocathode. Employing these active materials as the conversion medium thereby overcomes the limitations of narrow bandwidth and effective conversion only at high intensities of the passive material approach taught in U.S. Pat. No. 3,971,932 to Sewell et al., and renders the photomultiplier practical for use with low incident intensities in the near infrared.

The active material employed in the present invention will now be described in detail. The material preferably comprises: a base material selected from a group of alkaline earth metal sulfides, such as strontium sulfide or calcium sulfide; a first dopant of a samarium compound such as samarium oxide; a second dopant of europium compound such as europium oxide, strontium carbonate or calcium carbonate (to reduce phosphorescence) and a fusible salt.

Two exemplary mixtures for the preferred material are now described:

EXAMPLE 1

| Strontium sulfide | 90.43 parts |
|---|---|
| Strontium carbonate | 4.76 parts |
| Lithium fluoride | 4.76 parts |
| Samarium oxide | 100 parts per million |
| Europium oxide | 420 parts per million |

As used above and throughout this application, "parts" and "parts per million" shall refer to parts by weight unless otherwise noted.

The mixture is placed into a graphite crucible within a furnace flushed with a dry nitrogen atmosphere (derived from a liquid source) or other dry inert atmosphere such as argon, and heated to about 1300° C. for 30 minutes to one hour such that a fused mass is formed. This fusing temperature, about 100°-200° C. higher than that disclosed in U.S. Pat. Nos. 4,806,772 and 4,879,186, helps to reduce phosphorescence (which would otherwise contribute noise and degrade the practical sensitivity of the device).

After cooling, the fused mass is ground using standard techniques into a powder having a particle size on the order of 100 microns or less.

After grinding, the powdered material is heated to about 300° C. to 700° C. (preferably 600° C.) in the graphite crucible within the nitrogen or other inert atmosphere furnace. This second heating is below the fusing temperature of the material (about 700° C.) and is maintained for 10 to 60 minutes (preferably 30 minutes). This second heating step removes internal stresses and repairs damage done to the crystalline surfaces during the grinding step.

After the second heating, the material is cooled and the powdered material is then mixed with a suitable binder or vehicle such acrylic, polyethylene, or other organic polymer.

After the material has been mixed with a transparent binder, it is applied as a thin coating onto a transparent substrate 40 or directly onto the optical input faceplate of photo-multiplier 12. The coating of the photoluminescent material can be up to 100 microns in thickness, since no imaging is involved. The optimal coating is a few layers in thickness so that the photoluminescent material is sufficiently thick to absorb the infrared radiation, but not so thick that the emitted visible light cannot pass out the backside of the material. In an alternative embodiment of the invention, the material is layered very thick (so that the maximum amount of infrared energy is absorbed) and the large portion of visible light emitted from the front side of the material is detected by a photomultiplier facing the material and oriented at an angle with respect to the incoming infrared energy.

In the above mixture, the strontium sulfide serves as a base material whereas the lithium fluoride operates to provide the fusibility characteristics useful for the specific embodiment. Alternatively, other alkaline earth metal sulfides might be used as a base material. Similarly, a cerium compound dopant can be used in lieu of the europium compound dopant to yield a blue-green output rather than an orange output. However, the above orange emitting material is preferred because it has a brighter output.

The strontium carbonate in the above mixture is used in place of the barium sulfate disclosed in Ser. No. 034,334 to decrease phosphorescence. Preferably 4.76 parts are used as noted above, but between 1 and 10 parts may be used of the strontium carbonate as well as up to 10 parts of lithium fluoride relative to the 90.43 parts of strontium sulfide.

The samarium oxide and europium oxide in the above mixture are used for establishing the communication band and the electron trapping level. Preferably 100 parts per million of samarium oxide are used, but the samarium oxide could alternatively be between 20 parts per million and 300 parts per million. The europium oxide may be between 300 and 800 parts per million, with 420 parts per million being preferred.

Figure 4:
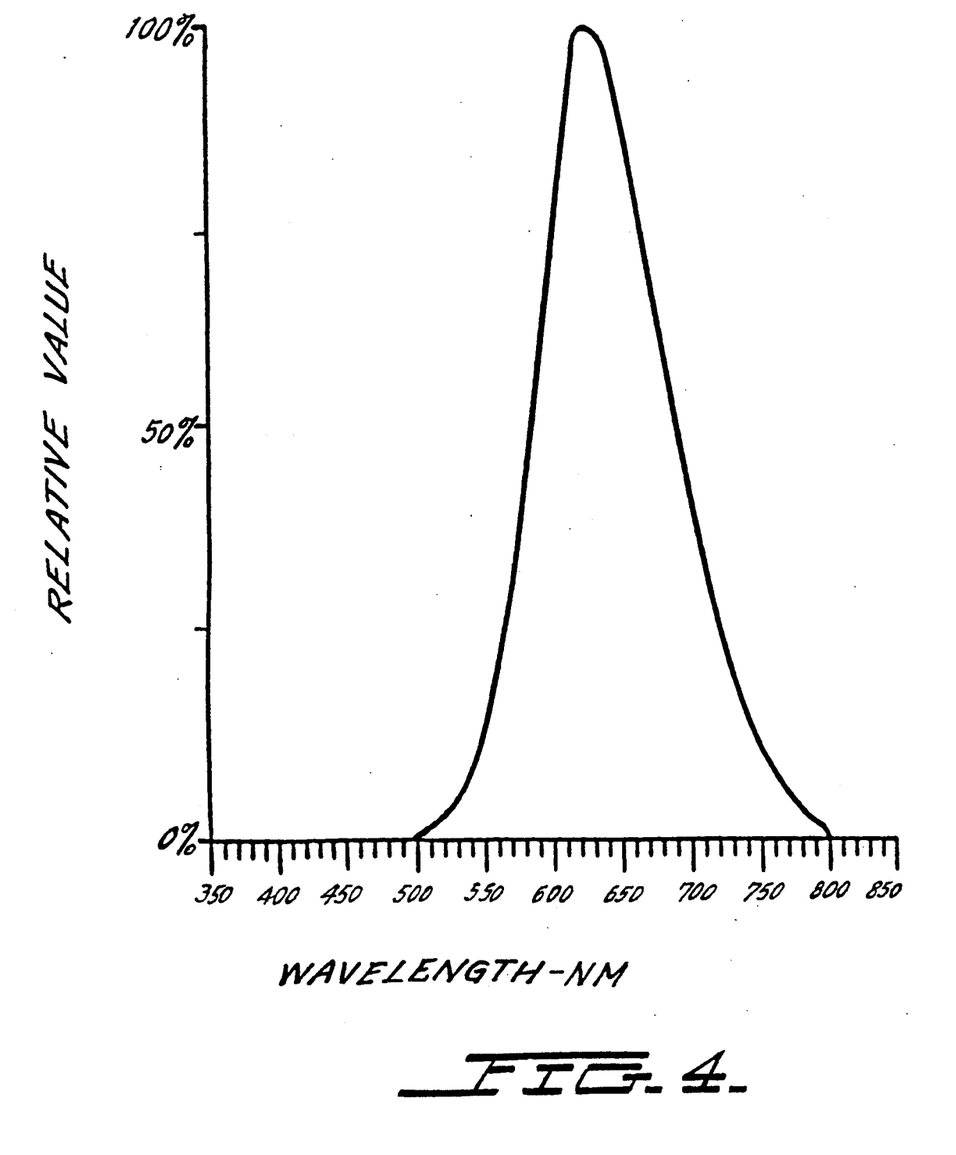
FIG. 4 shows the spectrum of light output by a first type of photoluminescent material which may be used as the energy upconverter.

The mixture resulting rom the above process provides a depth for electron traps of about 1.1 electron volts below the communication band and has an output spectrum as shown in FIG. 4, which illustrates that the center frequency of the output has a wavelength of approximately 630 nanometers, corresponding to a orange light. The IR sensitivity, identified as Example 1 in FIG. 6, ranges from about 0.8 micron to 1.5 microns and peaks at about 1 micron.

EXAMPLE 2

A second photoluminescent material for upconversion with extended IR sensitivity may be made with the following composition:

| Calcium sulfide | 87.20 parts |
|---|---|
| Calcium carbonate | 5.13 parts |
| Lithium fluoride | 7.62 parts |
| Samarium oxide | 170 parts per million |
| Europium oxide | 340 parts per million |

The above mixture is processed in the same manner as that of Example 1 by first heating to fusing, grinding the resultant fused mass, and then reheating at a temperature below the fusing temperature but sufficiently high to allow repair of damage to the crystalline parts. Cooling may be used after each of the heating and reheating steps. The same process steps, in terms of temperature and time intervals, may be used in processing this second material. The resulting powder may be ground as with Example 1, combined with a transparent binder or vehicle, and applied to the optically transparent substrate 40, or directly on the faceplate of the photomultiplier 12.

Figure 5:
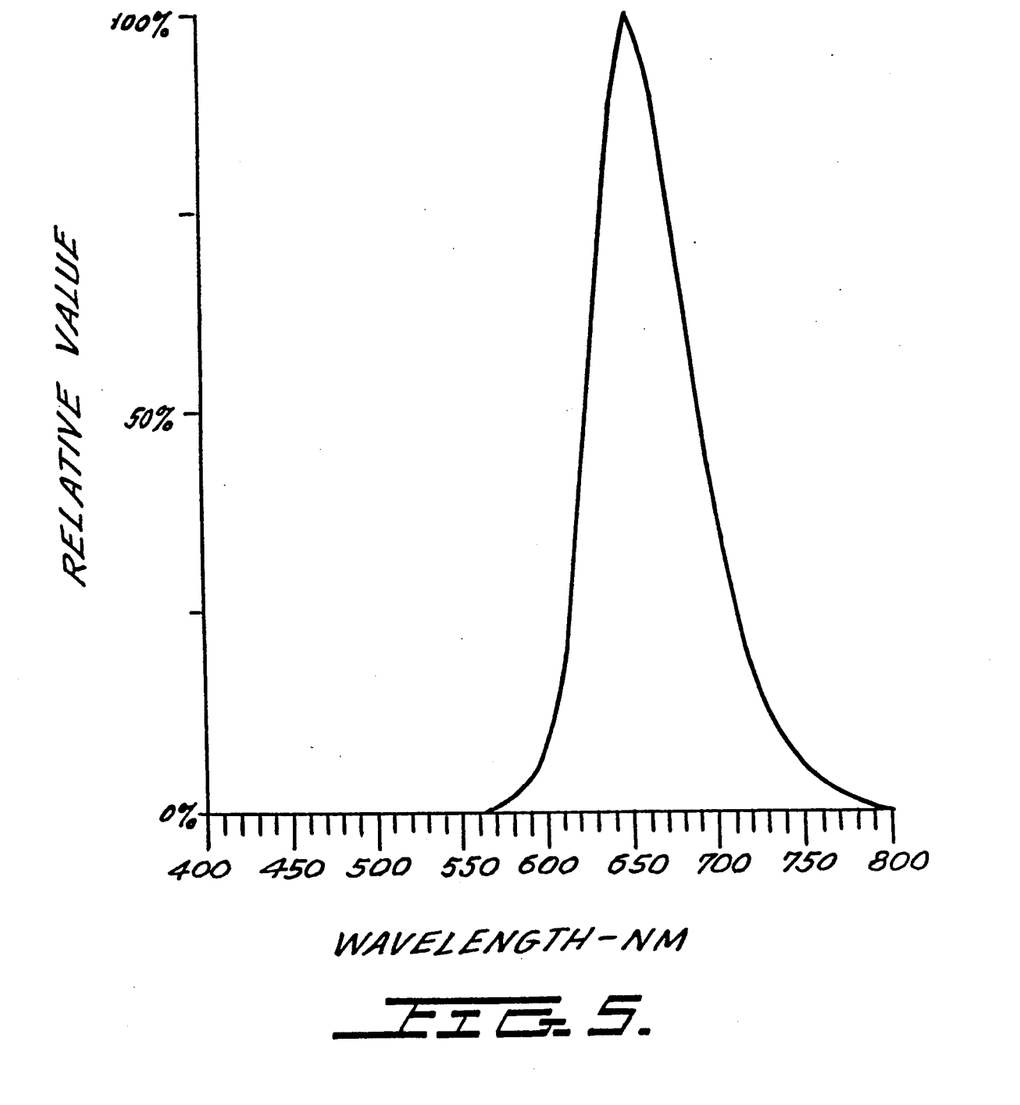
FIG. 5 shows the spectrum of light output by a second type of photoluminescent material which may be used as the energy upconverter.
Figure 6:
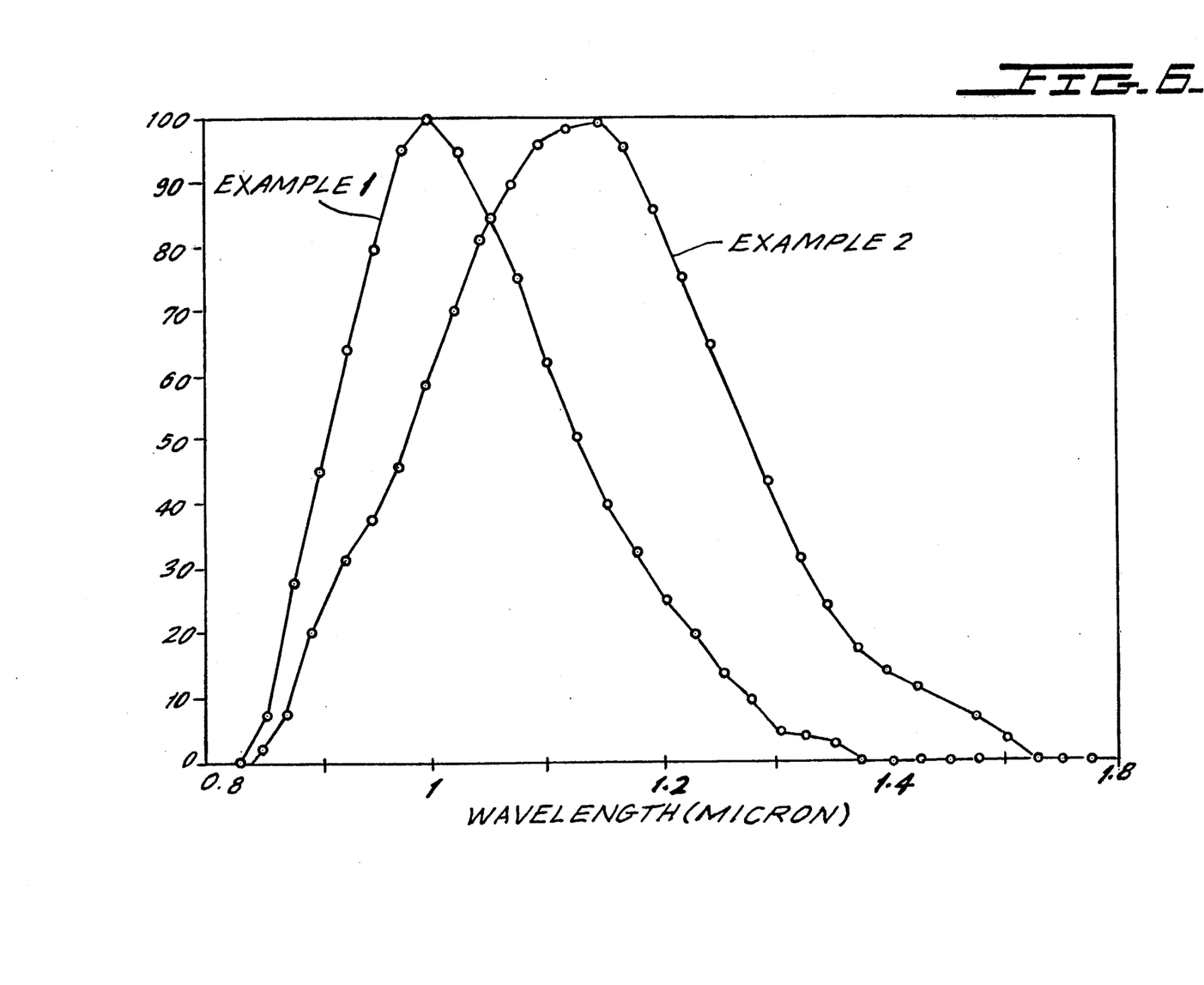
FIG. 6 shows infrared sensitivity of the first and second types of photoluminescent material which may be used for the energy upconverter.

In the above mixture, the calcium carbonate may vary from 1 part up to 10 parts, the lithium fluoride may vary between 0 and 10 parts, the samarium oxide may vary between 20 and 300 parts per million, and the europium oxide may vary between 100 and 800 parts per million. The specific values for portions which are given above provide highly superior characteristics such as sensitivity. The material of Example 2 charges up very quickly with light. The material holds the charge for extended periods of time similar to the material of Example 1 and will trigger re-emission of visible light at a wavelength of about 650 nanometers (reddish-orange light) upon application of an infrared source (the emission spectrum under IR stimulation is illustrated in FIG. 5). As with Example 1, a cerium compound may be substituted for the europium compound to yield a blue-green output with slightly reduced brightness. The infrared sensitivity of Example 2 as shown in FIG. 6, has an expanded range over that of Example 1, extending from about 0.8 micron to 1.7 microns and peaking at about 1.2 microns.

The materials of Examples 1 and 2, within the ranges specified, can also be deposited upon window 40 the faceplate of the photomultiplier by techniques such as physical vapor deposition, chemical vapor deposition, ion beam deposition, molecular beam deposition, and electron beam deposition. The listed materials can be mixed and then physically deposited on the substrate or the materials can be individually deposited; however, this is much more difficult and provides no additional benefits. A particularly successful method has been to mix the materials, hot press them into a solid and then evaporate or sputter them onto substrate 40 or the photomultiplier faceplate.

Obviously, the particular type of material employed in the present invention depends upon the sensitivity desired. The material described in Example 2 is considered optimum for most applications because it causes the greatest shift in response i.e., it is sensitive to light of relatively long wavelengths. However, if sensitivity to shorter infrared wavelengths is more important, e.g. detection of the output of a Nd:YAG laser, the optimum material would be that described in Example 1. Obviously, if upconverter 16 is removably mounted within assembly 10, it could be exchanged for an upconverter with shorter or longer wavelength sensitivity (Example 1 or Example 2) depending upon the particular application.

Although the present invention has been described in connection with preferred embodiments thereof, many variations and modifications will now become apparent to those skilled in the art. It is preferred, therefore, that the present invention be limited not by the specific disclosure herein, but only by the appended claims.

What is claimed is;

1. A photomultiplier assembly with extended sensitivity, comprising:
    a photomultiplier usefully responsive to electromagnetic energy in a first wavelength region; and
    active pre-charged photon energy conversion means for receiving electromagnetic energy of wavelengths longer than said first wavelength region and in a region to which said photomultiplier is insensitive and emitting electromagnetic energy in said first wavelength region in response thereto;
    said photomultiplier and energy conversion means being arranged such that the emission of electromagnetic energy in said first wavelength region from said energy conversion means is directed into said photomultiplier, whereby said photomultiplier provides information concerning incident electromagnetic energy of wavelengths longer than said first wavelength.

2. A photomultiplier assembly as recited in claim 1, further comprising means within said assembly for pre-charging said photon energy conversion means.

3. A photomultiplier assembly as recited in claim 2, wherein said photon energy conversion means comprises a photoluminescent material, and said means for pre-charging comprises a light source which emits visible light, said visible light raising electrons in said photoluminescent material from a ground level to a higher trapping energy level, said incident electromagnetic energy of wavelengths longer than said first wavelength releasing said electrons from said higher energy level, resulting in the emission from said material of light of said first wavelength.

4. A photomultiplier assembly as recited in claim 3, wherein said first wavelength comprises visible light and said electromagnetic energy of wavelengths longer than said first wavelength comprises infrared radiation.

5. A photomultiplier assembly as recited in claim 3, wherein said material has a strontium sulfide base.

6. A photomultiplier assembly as recited in claim 5, wherein said material further comprises dopants of europium and samarium compounds.

7. A photomultiplier assembly as recited in claim 6, wherein said material further comprises strontium carbonate.

8. A photomultiplier assembly as recited in claim 7, wherein said material further comprises lithium fluoride.

9. A photomultiplier assembly as recited in claim 3, wherein said material has a calcium sulfide base.

10. A photomultiplier assembly as recited in claim 9, wherein said material further comprises dopants of europium and samarium compounds.

11. A photomultiplier assembly as recited in claim 10, wherein said material further comprises calcium carbonate.

12. A photomultiplier assembly as recited in claim 11, wherein said material further comprises lithium fluoride.

13. A photomultiplier assembly as recited in claim 3, wherein said material is disposed on a sapphire substrate.

14. A photomultiplier assembly as recited in claim 1, wherein said assembly further includes housing means for said photon energy conversion means and said photomultiplier.

15. A photomultiplier assembly as recited in claim 1, wherein said photon energy conversion means is disposed with said assembly in the form of a replaceable disk.

16. A photomultiplier assembly as recited in claim 4, further comprising means for focussing said infrared radiation from a first area to a second area smaller than said first area and corresponding approximately to the area of said photoluminescent material, said means for focussing being disposed between said means for pre-charging said second area said photomultiplier.

17. A photomultiplier assembly as recited in claim 4, further comprising a long wavelength filter for filtering out visible light, said long-wavelength filter being disposed at the input side of said assembly and before said means for precharging.

18. A photomultiplier assembly as recited in claim 4, further comprising a first infrared mirror disposed between said long wavelength filter and said photon energy conversion means for reflecting back into said photoluminescent material any infrared radiation not absorbed by said photoluminescent material.

19. A photomultiplier assembly as recited in claim 18, further comprising a second infrared mirror disposed between said photon energy conversion means and said photomultiplier for reflecting back into said photoluminescent material any infrared light passing therethrough.

* * * * *